United States Patent
Kang

(10) Patent No.: US 7,054,182 B2
(45) Date of Patent: May 30, 2006

(54) NONVOLATILE FERAM CONTROL DEVICE

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/104,579

(22) Filed: Apr. 13, 2005

(65) Prior Publication Data
US 2005/0201138 A1  Sep. 15, 2005

Related U.S. Application Data

(62) Division of application No. 10/608,427, filed on Jun. 30, 2003, now Pat. No. 6,898,107.

(30) Foreign Application Priority Data
Nov. 12, 2002  (KR) .............................. 2002-70066

(51) Int. Cl.
G11C 11/22  (2006.01)
(52) U.S. Cl. ............ 365/145; 365/189.11; 365/189.12; 365/191; 365/230.06
(58) Field of Classification Search ................ 365/145, 365/189.11, 189.12, 191, 78, 230.06
See application file for complete search history.

(56) References Cited

U.S. PATENT DOCUMENTS 4,873,664 A   10/1989  Eaton, Jr.
5,815,430 A   9/1998   Verhaeghe et al.
5,917,746 A   6/1999   Seyyedy
6,101,119 A * 8/2000   Yi et al. ..................... 365/149
6,157,588 A   12/2000  Matsumoto et al.
6,157,598 A   12/2000  Mowry
6,707,700 B1  3/2004   Kang
6,721,198 B1  4/2004   Kang

* cited by examiner

Primary Examiner—Richard Elms
Assistant Examiner—Toan Le
(74) Attorney, Agent, or Firm—Heller Ehrman LLP

(57) ABSTRACT

Disclosed is a nonvolatile ferroelectric FeRAM control device which allows a programmable register to be stably driven in a low voltage region by controlling a pumping voltage supplied to the register. A pumping voltage controller is configured to output a pumping voltage control signal by receiving a power voltage control signal having a different output level according to a power voltage region where a power voltage belongs when the power control signal is applied. A cell plate voltage controller is configured to selectively output a cell plate pumping voltage control signal depending on states of the power voltage control signals when a cell plate control signal is applied. A write enable voltage controller is configured to selectively output a write enable pumping voltage control signal depending on states of the power voltage control signal, when a write enable control signal is applied. A register array including a plurality of unit registers is configured to boost and output voltage levels of data stored in a nonvolatile ferroelectric capacitor depending on voltage levels of the pumping voltage control signal, the cell plate pumping voltage control signal and the write enable pumping voltage control signal.

4 Claims, 16 Drawing Sheets

NONVOLATILE FERAM CONTROL DEVICE

This application is a divisional of U.S. application Ser. No. 10/608,427 filed on Jun. 30, 2003, now U.S. Pat. No. 6,898,107 which is hereby incorporated by reference in its entirety.

BACKGROUND OF THE INVENTION

1. Field of the Invention

The present invention generally relates to nonvolatile FeRAM (ferroelectric random access memory) control devices, and more specifically, to a nonvolatile FeRAM control device where a programmable register can be stably driven when a power voltage is boosted in a low voltage region.

2. Description of the Related Art

Generally, a ferroelectric randaom access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a hysteresis loop of a general ferroelectric substance.

A polarization induced by an electric field does not vanish but remains at a certain portion ('d' or 'a' state) even after the electric field is cleared due to existence of a residual (or spontaneous) polarization. The FeRAM cell is used as a memory device by corresponding the 'd' and 'a' states to binary values of '1' and '0', respectively.

FIG. 2 is a structural diagram illustrating a unit cell of the conventional FeRAM device.

The unit cell of the conventional FeRAM is provided with a bitline BL arranged in one direction and a wordline WL arranged in another direction vertical to the bitline BL. A plateline PL is arranged parallel to the wordline WL and spaced at a predetermined interval.

The unit cell is also provided with a transistor T1 having a gate connected to an adjacent wordline WL and a source connected to an adjacent bitline BL. A drain of the transistor T1 is connected to one terminal of a ferroelectric capacitor FC0. The other terminal of the ferroelectric capacitor FC0 is connected to the plateline PL.

The data input/output operation of the conventional FeRAM is now described referring to FIGS. 3a and 3b.

FIG. 3a is a timing diagram illustrating a write mode of the conventional FeRAM.

When entered into an active period, a chip enable signal CEB applied externally transits from a high to low level. If a write enable signal WEB simultaneously transits from a high to low level, the cell array is enabled to start a write mode. Thereafter, when an address is decoded in the write mode, a pulse applied to a corresponding wordline transits from a "low" to "high" level, thereby selecting the cell.

In the interval where the wordline WL is held at a high level, a high signal of a predetermined interval and a low signal of a predetermined interval are alternatively applied to a corresponding plateline PL. In order to write binary logic values '1' or '0' in the selected cell, 'high' or 'low' signals synchronously with respect to the write enable signal are applied to a corresponding bitline BL. Here, a sense amplifier enable signal SEN is maintained at a high level.

In other words, when a high signal is applied to a bitline BL and a low signal is applied to a plateline PL, a logic value "1" is written as input data in the ferroelectric capacitor FC0. When a low signal is applied to a bitline BL and a high signal is applied to a plateline PL, a logic value "0" is written as input data in the ferroelectric capacitor FC0.

FIG. 3b is a timing diagram illustrating a read mode of the FeRAM.

When entered into an active period, a chip enable signal CEB externally transits from a "high" to "low" level. All bitlines are equalized to a "low" level by an equalization signal before selection of a required wordline WL.

After each bitline is inactivated and an address is decoded, the required wordline WL is transited from a "low" to "high" level by the decoded address, thereby selecting a corresponding unit cell. A "high" signal is applied to a plateline PL of the selected cell to destroy data Qs corresponding to the logic value "1" stored in the FeRAM.

If the logic value "0" is stored in the FeRAM, its corresponding data Qns will not be destroyed. In this way, the destroyed and non-destroyed data output different values, respectively, according to the above-described hysteresis loop characteristics.

In other words, as shown in the hysteresis loop of FIG. 1, the state moves from the 'd' to 'f' when the data is destroyed while the state moves from 'a' to 'f' when the data is not destroyed. As a result, the sense amplifier is enabled by the sense amplifier enable signal SEN after the lapse of a predetermined time. When the data is destroyed, the sense amplifier outputs a logic value "1" as output data DOUT. However, when the data is not destroyed, the sense amplifier outputs a logic value "0" as output data DOUT.

After the sense amplifier amplifies the data, the data should be recovered into the original data. Accordingly, the plateline PL is inactivated from "high" to "low" at the state whereby a 'high' signal is applied to the required wordline WL.

In the conventional nonvolatile FeRAM, metal/poly silicon (Poly-Si) wirings are used in a redundancy operation. However, an erroneous wiring cannot be restored to the original state because a laser cutting is used in the conventional redundancy operation. Moreover, the reliability of conventional FeRAM chips is degraded because it is impossible to exactly regulate reference levels for controlling cell data.

A method for regulating redundancy and reference levels of memory cells using a programmable unit register has been disclosed in order to overcome the above-described problems. However, the conventional programmable unit register controls a register by using an external power voltage VCC other than a pumping voltage VPP.

Generally, the programmable unit register is known to normally operate in a high voltage region above 1.0V. According to a power voltage boosting method, operation margin of the programmable unit is required to be secured in a low voltage region below 1.0V. When the conventional programmable unit register continuously operates at a pumping voltage VPP, power is consumed too much while generating the pumping voltage VPP. Accordingly, a circuit using a pumping voltage VPP with much less power consumption is disclosed in the present invention.

SUMMARY OF THE INVENTION

It is an object of the present invention to provide a nonvolatile FeRAM control device where a programmable register is stably driven when a power voltage is boosted in a low voltage region, thereby minimizing power consumption and improving reliability of a chip.

A nonvolatile FeRAM control device is provided, comprising a pumping voltage controller, a cell plate voltage controller, a write enable voltage controller, and a register array including a plurality of unit registers. The pumping voltage controller is configured to output a pumping voltage control signal by receiving a power voltage control signal having a different output level according to a power voltage region where a power voltage belongs, when the power control signal is applied. The cell plate voltage controller is configured to selectively output a cell plate pumping voltage control signal depending on states of the power voltage control signal, when a cell plate control signal is applied. The write enable voltage controller is configured to selectively output a write enable pumping voltage control signal depending on states of the power voltage control signal, when a write enable control signal is applied. The register array including a plurality of unit registers is configured to boost and output voltage levels of data stored in a nonvolatile ferroelectric capacitor depending on voltage levels of the pumping voltage control signal, the cell plate pumping voltage control signal and the write enable pumping voltage control signal.

A nonvolatile FeRAM control device is also provided, comprising a pumping voltage driver. The pumping voltage driver is configured to amplify and pull up both nodes of a unit register including a nonvolatile ferroelectric capacitor in response to a pumping voltage control signal inputted at a timing different from a power voltage control signal in a low voltage region. The pumping voltage driver is configured to be formed on a N-well region separated from other N-well regions of adjacent circuits, and to receive the pumping voltage control signal.

A nonvolatile FeRAM control device is also provided, comprising a pumping voltage controller. The pumping voltage controller is configured to output a pumping voltage control signal for boosting an output signal of a unit register including a nonvolatile ferroelectric capacitor by pumping a power voltage in response to a power control signal. The pumping voltage controller outputs the pumping voltage control signal as the pumping voltage level by pumping a power voltage in a low voltage region, and the pumping voltage controller outputs the pumping voltage control signal as the power voltage level in a high voltage region Depending on states of a power voltage control signal for determining generation of a pumping voltage.

A nonvolatile FeRAM control device is also provided, comprising a cell plate voltage controller. The cell plate voltage controller is configured to output a pumping voltage control signal into a cell plate of a nonvolatile ferroelectric capacitor in a unit register depending on states of a power voltage control signal when a cell plate control signal. When the cell plate control signal is inputted as a high level in a low voltage region where the power voltage control signal is at a high level, the cell plate voltage controller outputs the cell plate: pumping voltage control signal as a power voltage level for a predetermined delay time, and outputs the cell plate pumping voltage control signal as a pumping voltage level after the delay time.

A nonvolatile FeRAM control device is also provided, comprising a write enable voltage controller. The write enable voltage controller is configured to output a write enable pumping voltage control signal into both nodes of a unit register including a nonvolatile ferroelectric capacitor depending on states of the power votlage control signal when a write enable control signal is applied. When the write enable control signal is inputted as a high level in a low voltage region where the power voltage control signal is at a high level, the write enable voltage controller outputs the write enable pumping voltage control signal as a power voltage level for a predetermined delay time, and outputs the write enable pumping voltage control signal as a pumping voltage elevel after the delay time.

A nonvolatile FeRAM control device is also provided, comprising an I/O setup controller, a register array, a data I/O controller, and an I/O buffer. The I/O setup controller is configured to set up activation or inactivation of a plurality of sub data I/O pins included in a plurality of data I/O pins. The register array is configured to comprise a plurality of unit registers including a nonvolatile ferroelectric capacitor, and to be selectively activated depending on the control of the I/O setup controller. The data I/O controller is configured to output a control signal for setting up an I/O pin by analyzing data applied from the register array. The I/O buffer is configured to selectively activate the plurality of sub data I/O pins in response to a control signal applied from the data I/O controller.

A nonvolatile FeRAM control device is also provided, comprising a sector protection setup controller, a register array, and a memory sector controller. The sector protection setup controller is configured to set up a sector protection region for protecting data written in a memory array region including a plurality of sector regions. The register array is configured to comprise a plurality of unit registers including a nonvolatile ferroelectric capacitor, and to be selectively activated depending on the control of the sector protection setup controller. The memory sector controller is configured to control a corresponding sector of the memory array region by analyzing sector protection information applied from the register array.

DETAILED DESCRIPTION OF THE PREFERRED EMBODIMENTS

The present invention will be described in detail with reference to the accompanying drawings.

Figure 1:
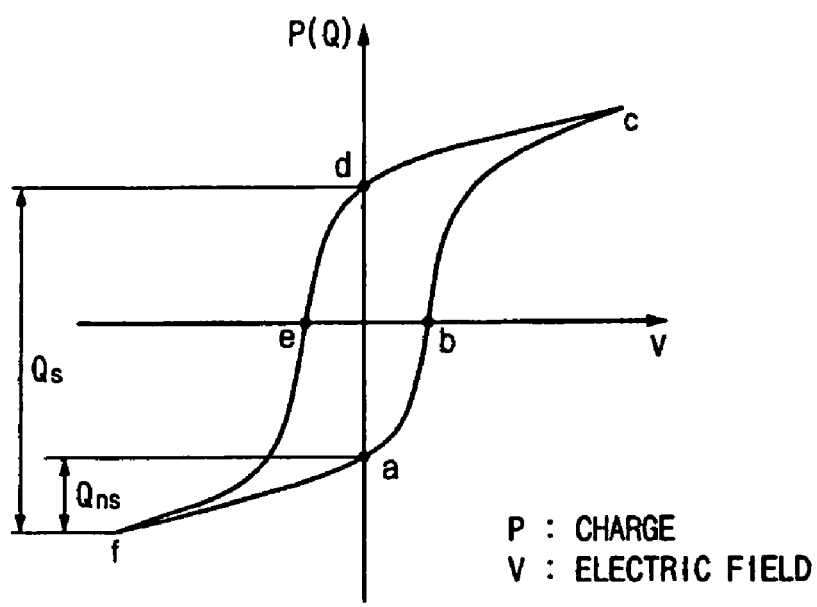
FIG. 1 is a characteristic curve showing a hysteresis loop of a general ferroelectric substance.
Figure 2:
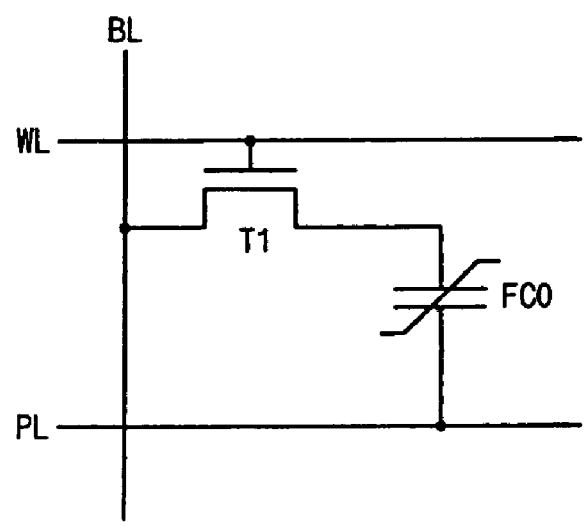
FIG. 2 is a structural diagram showing a unit cell in a conventional nonvolatile ferroelectric memory device.
Figure 3A:
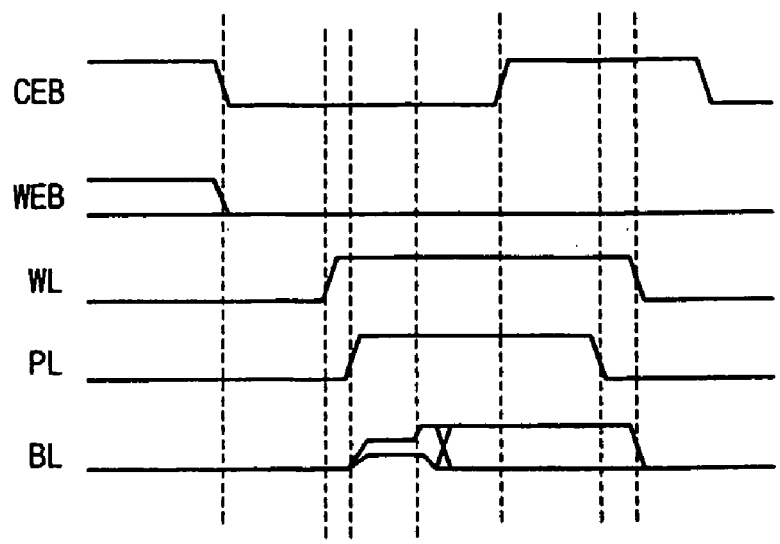
FIG. 3a is a timing diagram showing a write mode operation of the conventional nonvolatile ferroelectric memory device.
Figure 3B:
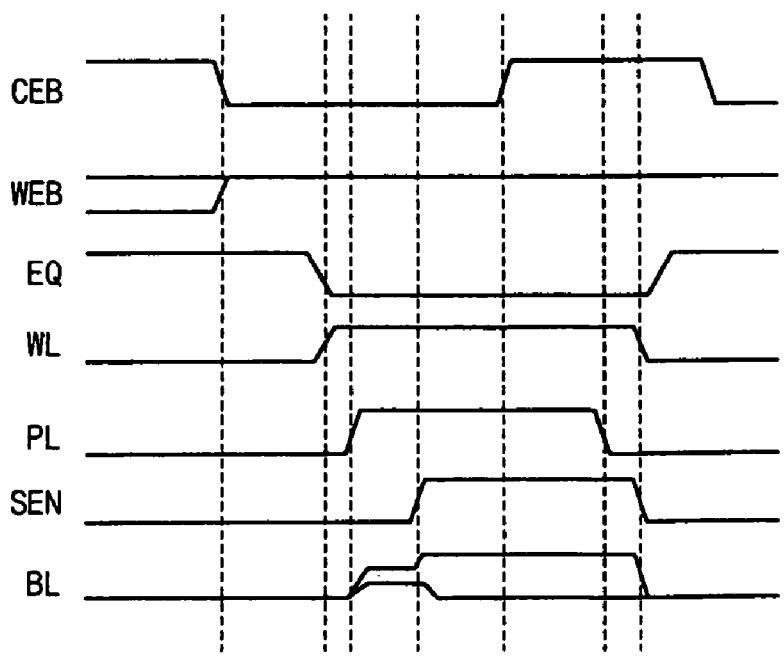
FIG. 3b is a timing diagram showing a read mode operation of the conventional nonvolatile ferroelectric memory device.
Figure 4:
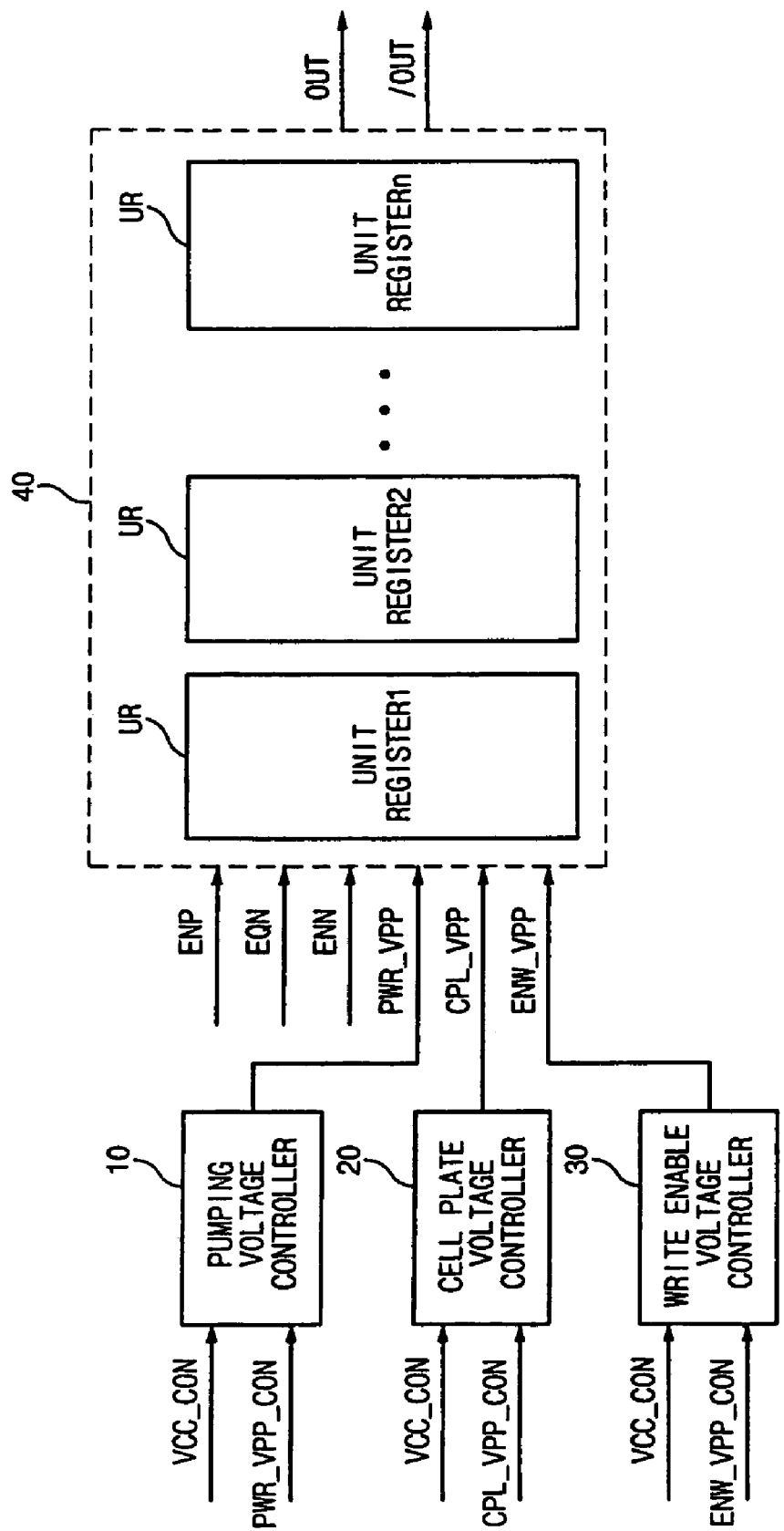
FIG. 4 is a structural diagram showing a nonvolatile FeRAM control device according to the present invention.

FIG. 4 is a structural diagram showing a nonvolatile FeRAM control device according to the present invention.

The disclosed nonvolatile FeRAM control device comprises a pumping voltage controller 10, a cell plate voltage controller 20, a write enable voltage controller 30 and a register array 40.

The pumping voltage controller 10 outputs a pumping voltage control signal PWR_VPP in response to a power voltage control signal VCC_CON and a power control signal PWR_VPP_CON.

The cell plate voltage controller 20 outputs a cell plate pumping voltage control signal CPL_VPP in response to the power voltage control signal VCC_CON and a cell plate control signal CPL_VPP_CON.

The write enable voltage controller 30 outputs a write enable pumping voltage control signal ENW_VPP in response to the power voltage control signal VCC_CON and a write enable control signal ENW_VPP_CON.

The register array 40 comprises a plurality of unit registers UR.

Each unit register UR outputs output signal OUT and /OUT by selectively boosting a voltage level of data stored in a nonvolatile ferroelectric capacitor depending on states of a pull-up enable signal ENP, an equalizing signal EQN, a pull-down enable signal ENN, a pumping voltage control signal PWR_VPP, a cell plate pumping voltage control signal CPL_VPP and a write enable pumping voltage control signal ENW_VPP.

Figure 5:
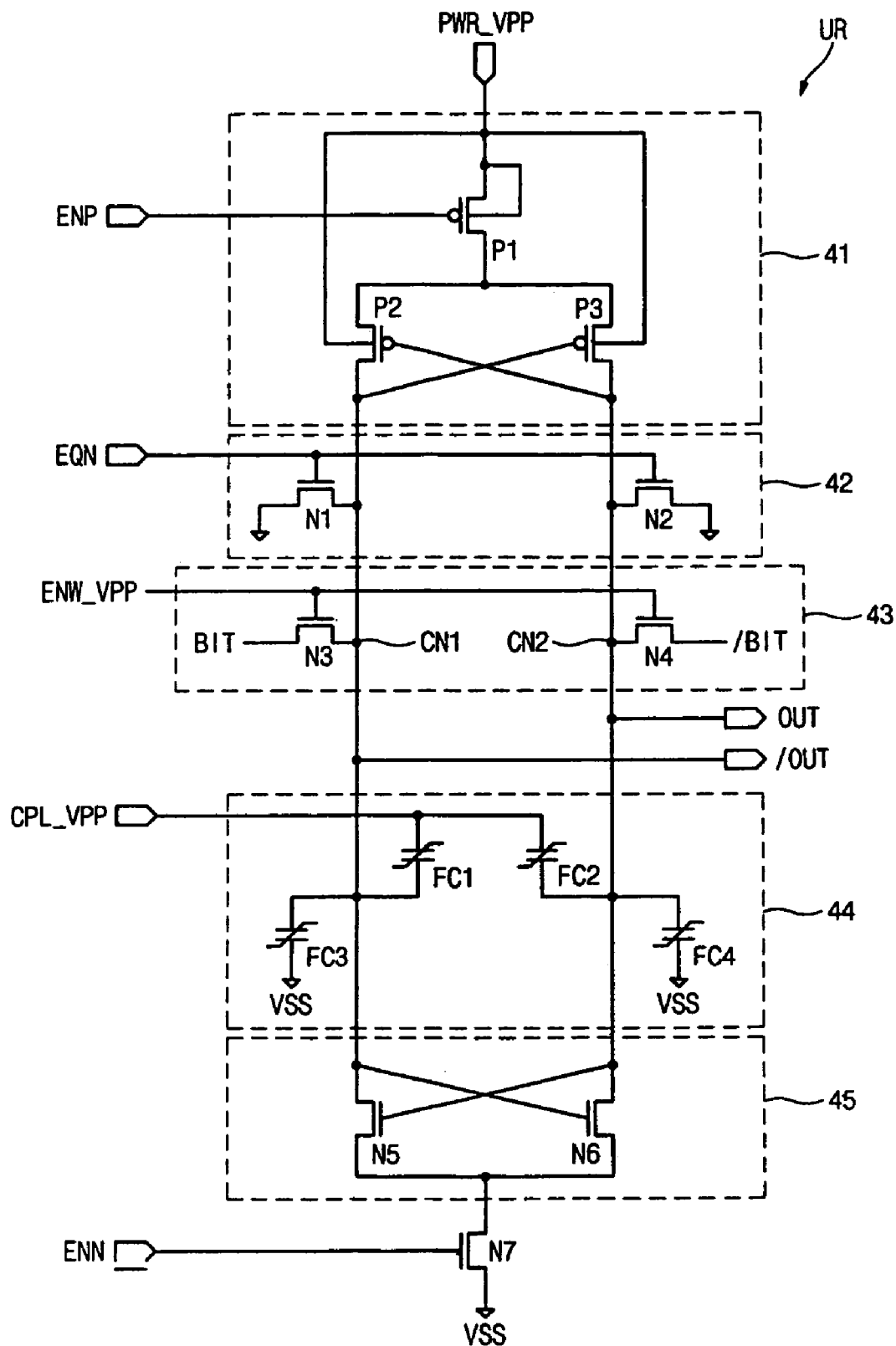
FIG. 5 is a detailed circuit diagram showing a unit register of FIG. 4.

FIG. 5 is a detailed circuit diagram showing the unit register UR of FIG. 4.

The unit register UR comprises a pumping voltage driver 41, an equalizer 42, a write enable pumping driver 43, a ferroelectric capacitor unit 44, a voltage driver 45 and a pull-down driving device N7.

The pumping voltage driver 41 formed on a N-well region separated from other circuit blocks comprises PMOS transistors P1~P3.

The PMOS transistor P1 connected between a pumping voltage control signal PWR_VPP terminal and a common source of the PMOS transistors P2, P3 has a gate to receive a pull-up enable signal ENP.

The PMOS transistors P2 and P3 control amplification of internal nodes CN1 and CN2 of the unit register UR. A gate of the PMOS transistor P2 is connected to a drain of the PMOS transistor P3. A gate of the PMOS transistor P3 is connected to a drain of the PMOS transistor P2.

The PMOS transistors P1~P3 are formed on a N-well region separated from other circuit blocks. The pumping voltage control signal PWR_VPP is applied to the N-well region.

The equalizer 42 comprises NMOS transistors N1 and N2 configured to pull down the nodes CN1 and CN2 when a power is initially turned on.

The NMOS transistor N1 and N2 have each source to receive a ground voltage, and each drain connected to the nodes CN1 and CN2. The NMOS transistors N1 and N2 equalize both the nodes CN1 and CN2 of the unit register UR by receiving the equalizing signal EQN through a common gate.

The write enable pumping driver 43 comprises NMOS transistors N3 and N4. The NMOS transistors N3 and N4 control selective connection of both nodes CN1 and CN2 and bitlines BIT and /BIT depending on states of the write enable pumping voltage control signal ENW_VPP received through a common gate.

The ferroelectric capacitor unit 44 comprises ferroelectric capacitors FC1~FC4. Each ferroelectric capacitor FC1 and FC2 has one terminal connected to the nodes CN1 and CN2, and the other terminal to receive the cell plate pumping voltage control signal CPL_VPP. Each ferroelectric capacitor FC3 and FC4 has one terminal connected to the nodes CN1 and CN2, and the other terminal to receive a ground voltage VSS. The ferroelectric capacitors FC3 and FC4 regulate capacitor load of the nodes CN1 and CN2 of the unit register UR.

The voltage driver 45 comprises NMOS transistors N5 and N6. A gate of the NMOS transistor N5 is connected to a drain of the NMOS transistor N6, and a gate of the NMOS transistor N6 is connected to a drain of the NMOS transistor N5.

The NMOS transistor N7 connected between a common source of the NMOS transistors N5 and N6 and a ground voltage VSS, has a gate to receive the pull-down enable signal ENN.

Figure 6:
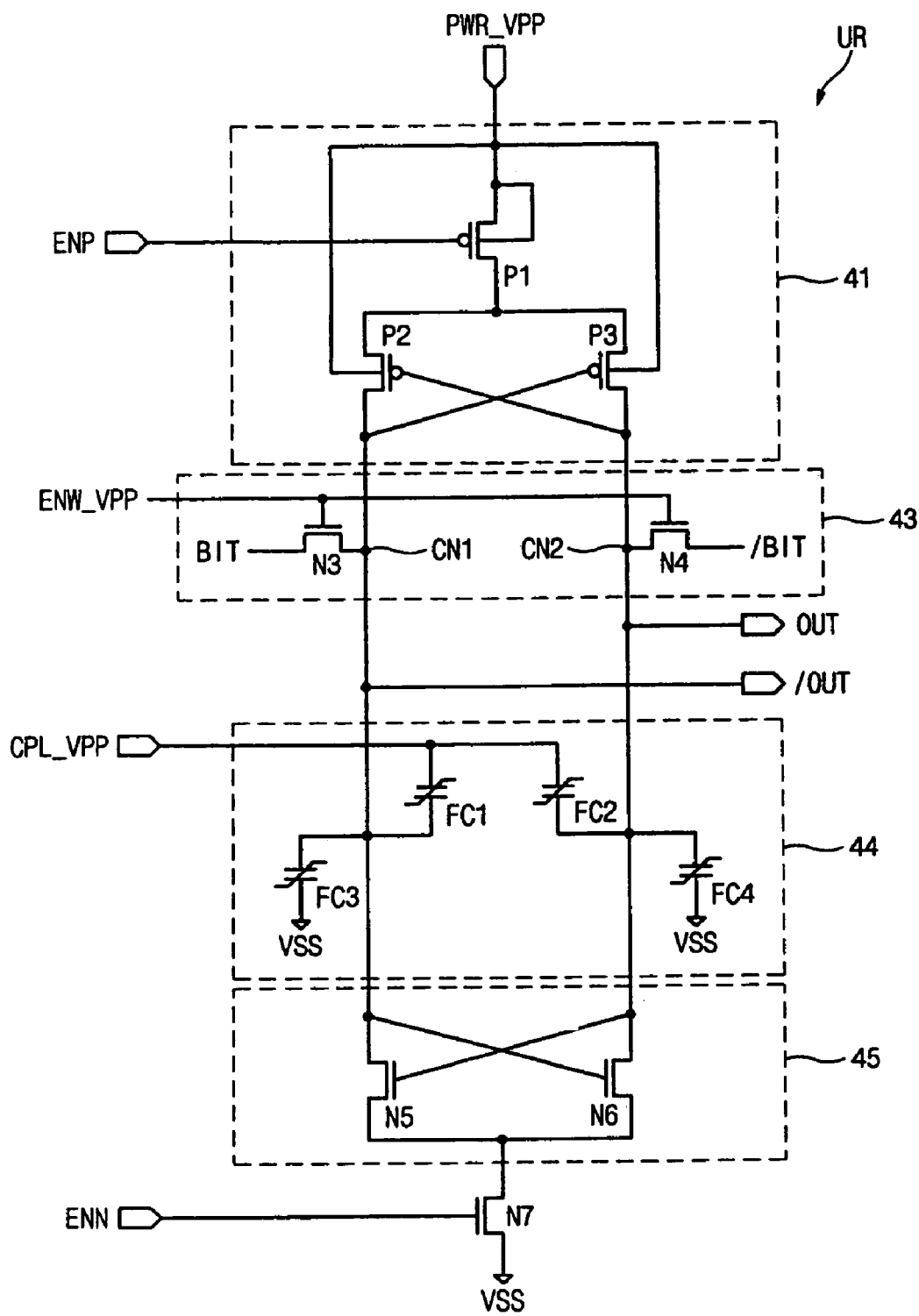
FIGS. 6 to 9 are other examples showing the unit register of FIG. 4.

FIG. 6 is another example showing the unit register UR of FIG. 4.

The unit register UR of FIG. 6 does not comprise the equalizer 42 of FIG. 5 for controlling pull-down operations of the output signals OUT and /OUT at the initial power-on state. When a power voltage is not supplied at the initial power-on state, the pull-down operation can be omitted if the internal output signal OUT of the register has the same voltage level as that of the output signal /OUT. The rest configuration is not explained because it is the same as the structure of FIG. 5.

Figure 7:
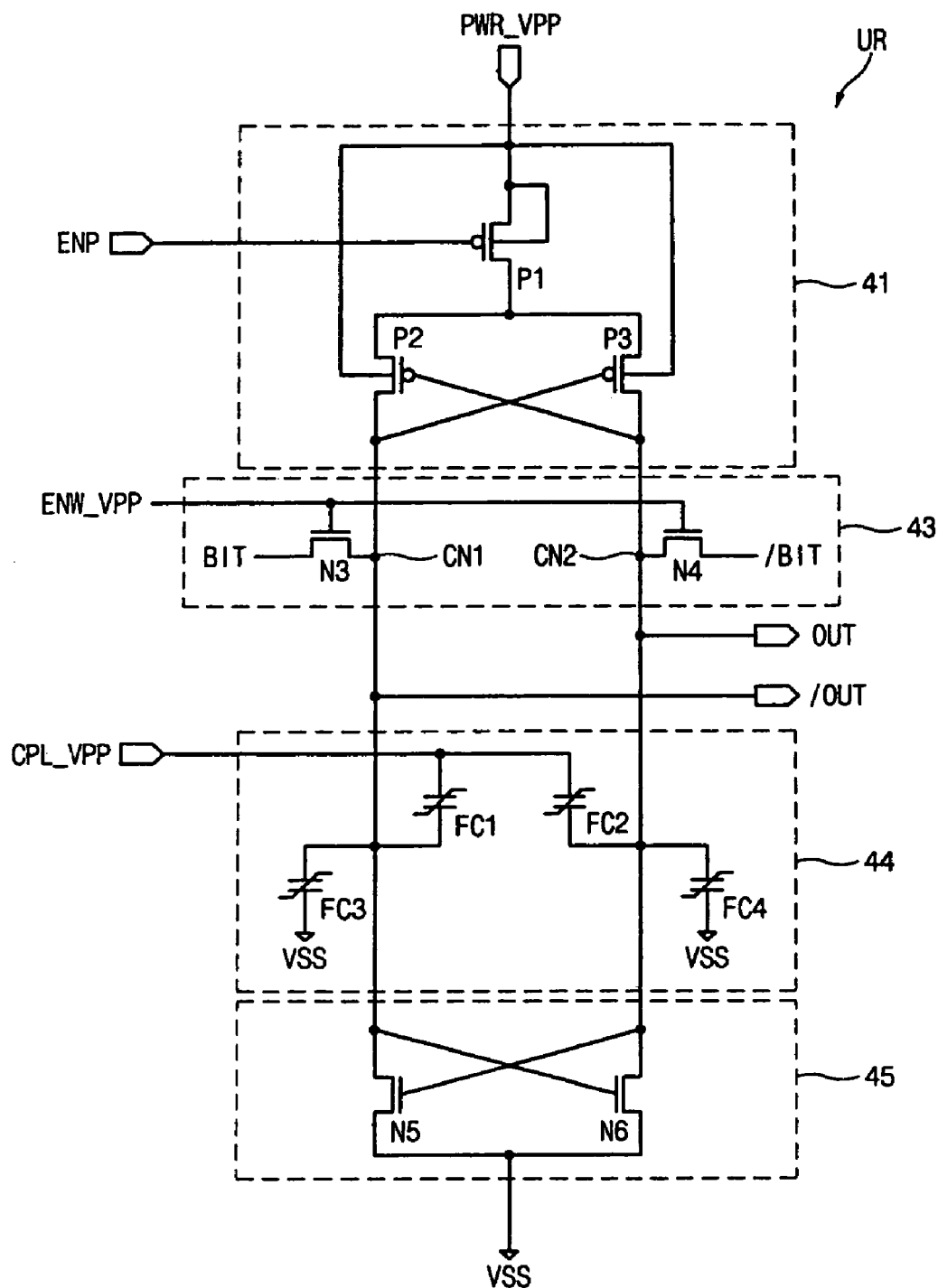

FIG. 7 is still another example of the unit register UR according to the present invention.

The unit register UR of FIG. 7 does not comprise the NMOS transistor N7 of FIG. 6 for controlling pull-down amplifying activation of the unit register UR. When the output nodes CN1 and CN2 are amplified in a forward feed-back type depending on sensing voltage level of the output signals OUT and /OUT, the pull-down amplifying activation is operatable without the NMOS transistor N7. The rest configuration of FIG. 7 is not explained because it is the same with that of FIG. 6.

Figure 8:
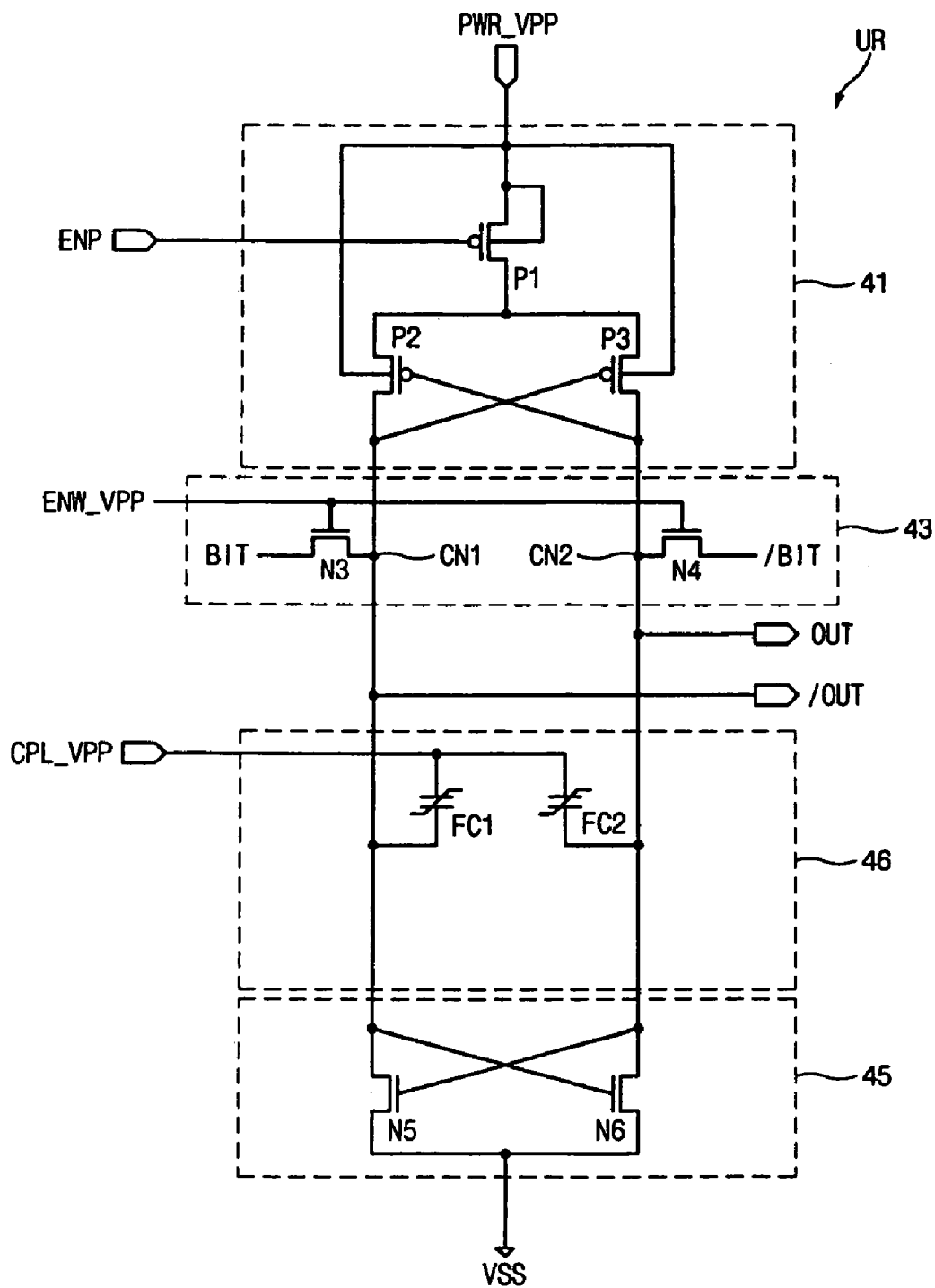

FIG. 8 is still another example of the unit register UR according to the present invention.

The ferroelectric capacitor unit 46 of the unit register UR of FIG. 8 has a different structure from that of FIG. 7. The ferroelectric capacitor unit 46 of FIG. 8 does not comprise the ferroelectric capacitors FC3 and FC4 for regulating capacitor load of both nodes CN1 and CN2 of the register.

The capacitative component values of the PMOS transistors and the NMOS transistors connected to the nodes CN1 and CN2 are used as sensing capacitors. As a result, the applicability is improved as the size of the ferroelectric capacitors FC1 and FC2 for storing data becomes smaller. In this case, the ferroelectric capacitors FC3 and FC4 can be omitted. The rest configuration of FIG. 8 is not explained because it is the same as that of FIG. 7.

Figure 9:
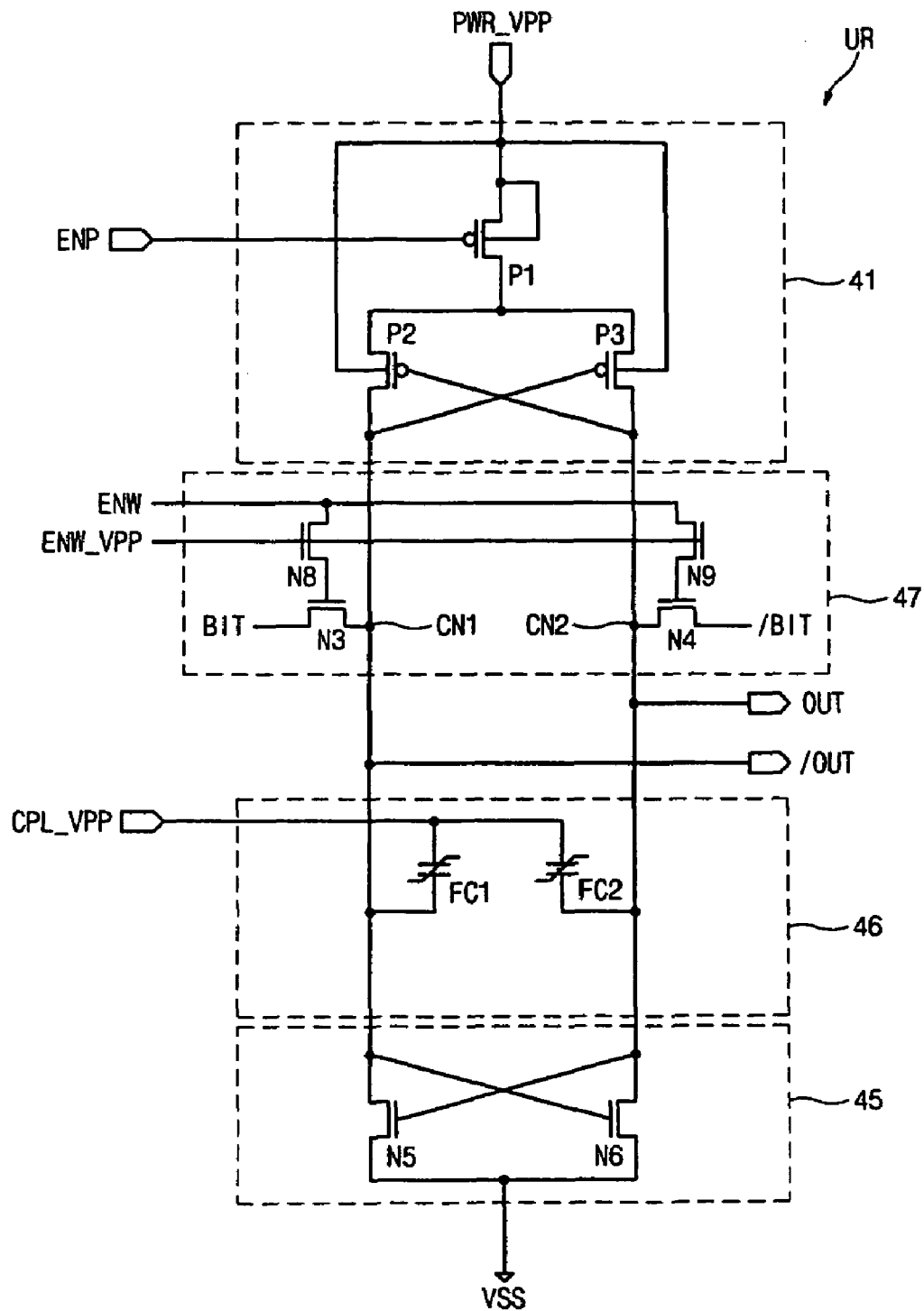

FIG. 9 is still another example of the unit register UR according to the present invention.

The write enable pumping driver 47 of the unit register UR of FIG. 9 has a different structure from that of FIG. 8.

In the unit register UR of FIG. 9, write data having a low voltage level inputted through the bitlines BIT and /BIT can be precisely transmitted without loss of voltage.

The write enable pumping driver 47 of FIG. 9 further comprises NMOS transistors N8 and N9. The NMOS transistor N8 connected between a gate of the NMOS transistor N3 and a write enable signal ENW terminal has a gate to receive the write enable pumping voltage control signal ENW_VPP. The NMOS transistor N9 connected between a gate of the NMOS transistor N4 and the write enable signal ENW terminal has a gate to receive the write enable pumping voltage control signal ENW_VPP.

Here, the NMOS transistors N3 and N4 selectively connects the nodes CN1 and CN2 to the bitlines BIT and /BIT depending on states of the write enable signal ENW when the write enable pumping voltage control signal ENW_VPP is activated. The rest configuration of FIG. 9 is not explained because it is the same with that of FIG. 8.

Figure 10:
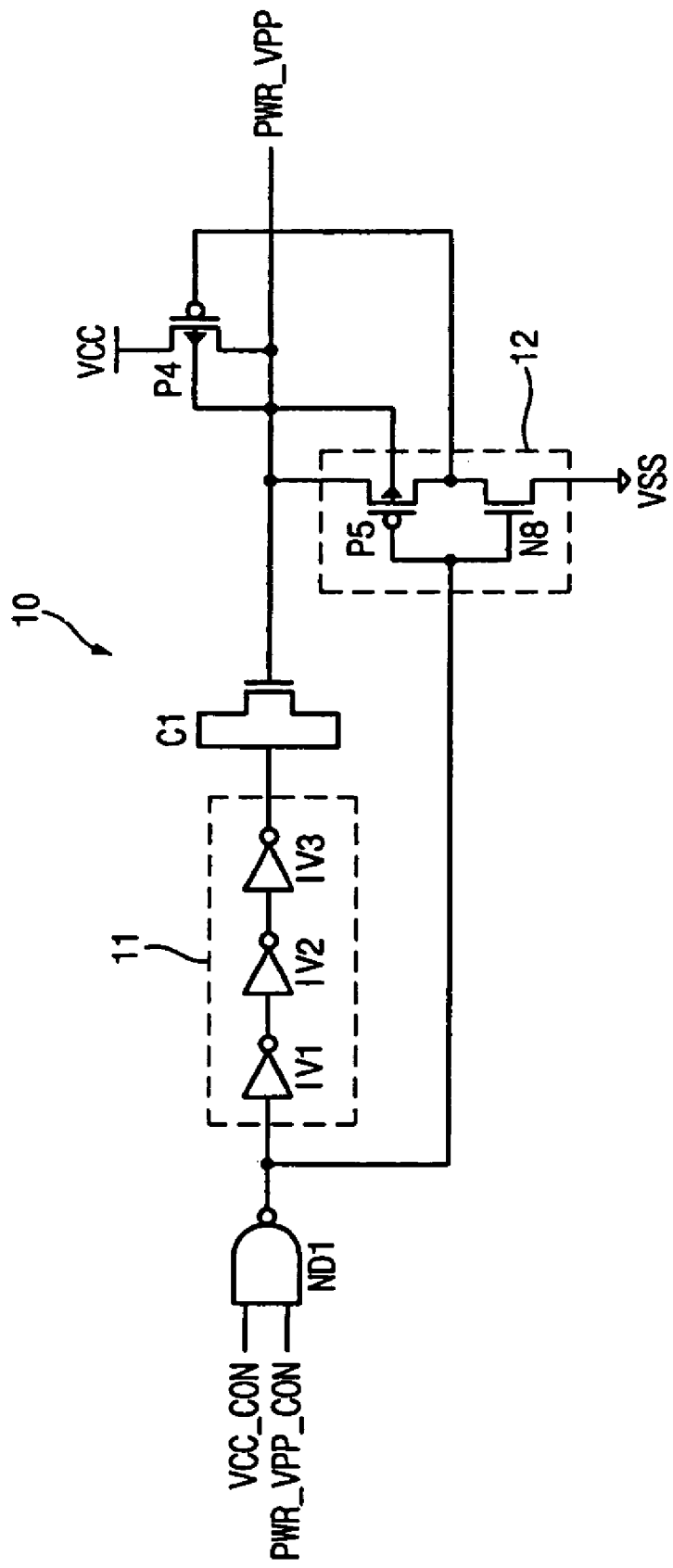
FIG. 10 is a detailed circuit diagram showing a pumping voltage controller of FIG. 4.

FIG. 10 is a detailed circuit diagram showing the pumping voltage controller 10 of FIG. 4.

The pumping voltage controller 10 comprises a NAND gate ND1, a delay unit 11, a MOS capacitor C1, a driver 12 and a PMOS transistor P4 as a pull-up driving device.

The NAND gate ND1 NANDs the power voltage control signal VCC_CON and the power control signal PWR_VPP_CON. The delay unit 11 comprises inverters IV1~IV3 connected in series for inverting and delaying an output signal of the NAND gate ND1.

The MOS capacitor C1 pumps a voltage level of the pumping voltage control signal PWR_VPP precharged to a power voltage level VCC depending on activation of the PMOS transistor P4. The PMOS transistor P4 connected between a power voltage VCC terminal and an output terminal of the MOS capacitor C1 has a gate to receive an output signal of the driver 12.

The driver 12 comprises a PMOS transistor P5 and the NMOS transistor N8 connected in series between a drain of the PMOS transistor P4 and a ground voltage VSS terminal. The PMOS transistor P5 and the NMOS transistor N8 have a common gate to receive an output signal of the NAND gate ND1.

The operation of the pumping voltage controller 10 is now explained.

When the power voltage control signal VCC_CON and the power control signal PWR_VPP_CON are inputted at a high level to pump a power voltage VCC in a low voltage region, the NAND gate ND1 outputs a signal having a low level.

The PMOS transistor P5 of the driver 12 is turned on by the output signal of the NAND gate ND1, and the PMOS transistor P4 is turned off. As a result, the power voltage VCC is pumped by the MOS capacitor C1, and the pumping voltage control signal PWR_VPP is outputted at a pumping voltage level VPP.

However, when the power voltage control signal VCC_CON, a power voltage limit detecting signal, is inputted at a low level in a high voltage region, the NAND gate ND1 outputs a high level signal.

The NMOS transistor N8 of the driver 12 is turned on by the output signal of the NAND gate ND1, and the PMOS transistor P4 is turned on. As a result, an output signal of the MOS capacitor C1 is at a low level, and the pumping voltage control signal PWR_VPP is outputted at a power voltage level VCC.

Figure 11:
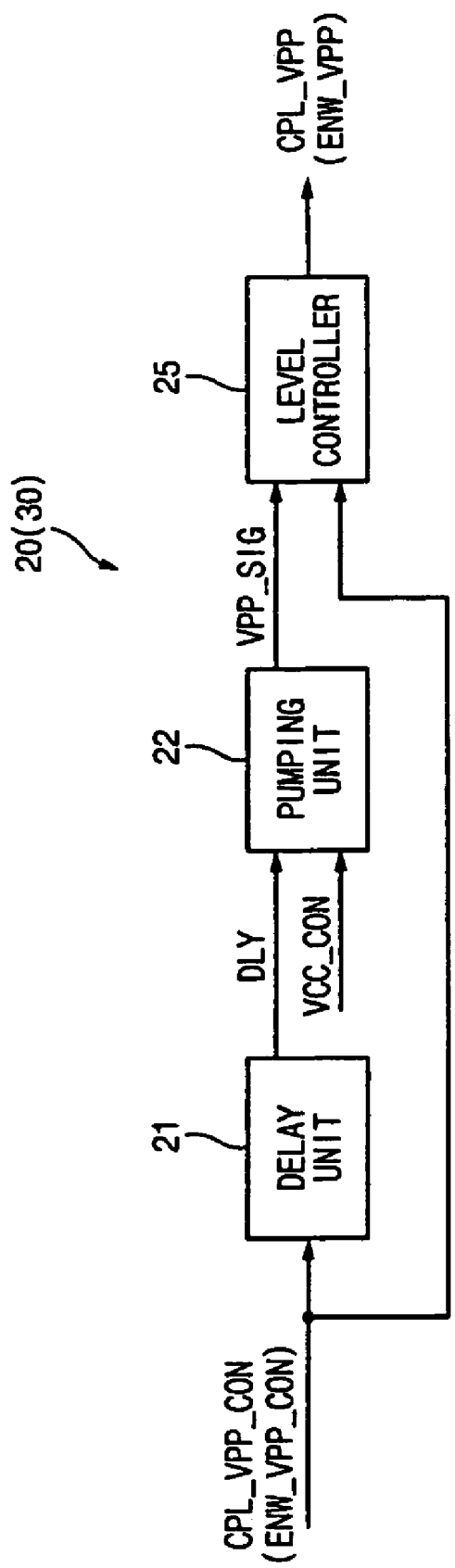
FIG. 11 is a detailed structural diagram showing a cell plate voltage controller and a write enable voltage controller of FIG. 4.

FIG. 11 is a detailed structural diagram showing the cell plate voltage controller 20 and the write enable voltage controller 30 of FIG. 4. Here, only the configuration of the cell plate voltage controller 20 is explained because the write enable voltage controller 30 has the same configuration and operation as those of the cell plate voltage controller 20.

The cell plate voltage controller 20 comprises a delay unit 21, a pumping unit 22 and a level controller 25.

The delay unit 21 outputs a delay signal DLY by delaying the cell plate control signal CPL_VPP_CON for a predetermined time. The pumping unit 22 outputs a pumping signal VPP_SIG by pumping a power voltage in response to the power voltage control signal VCC_CON and the delay signal DLY. The level controller 25 outputs cell plate pumping voltage control signal CPL_VPP by level-shifting the pumping signal VPP_SIG and the cell plate control signal CPL_VPP_CON.

Figure 12:
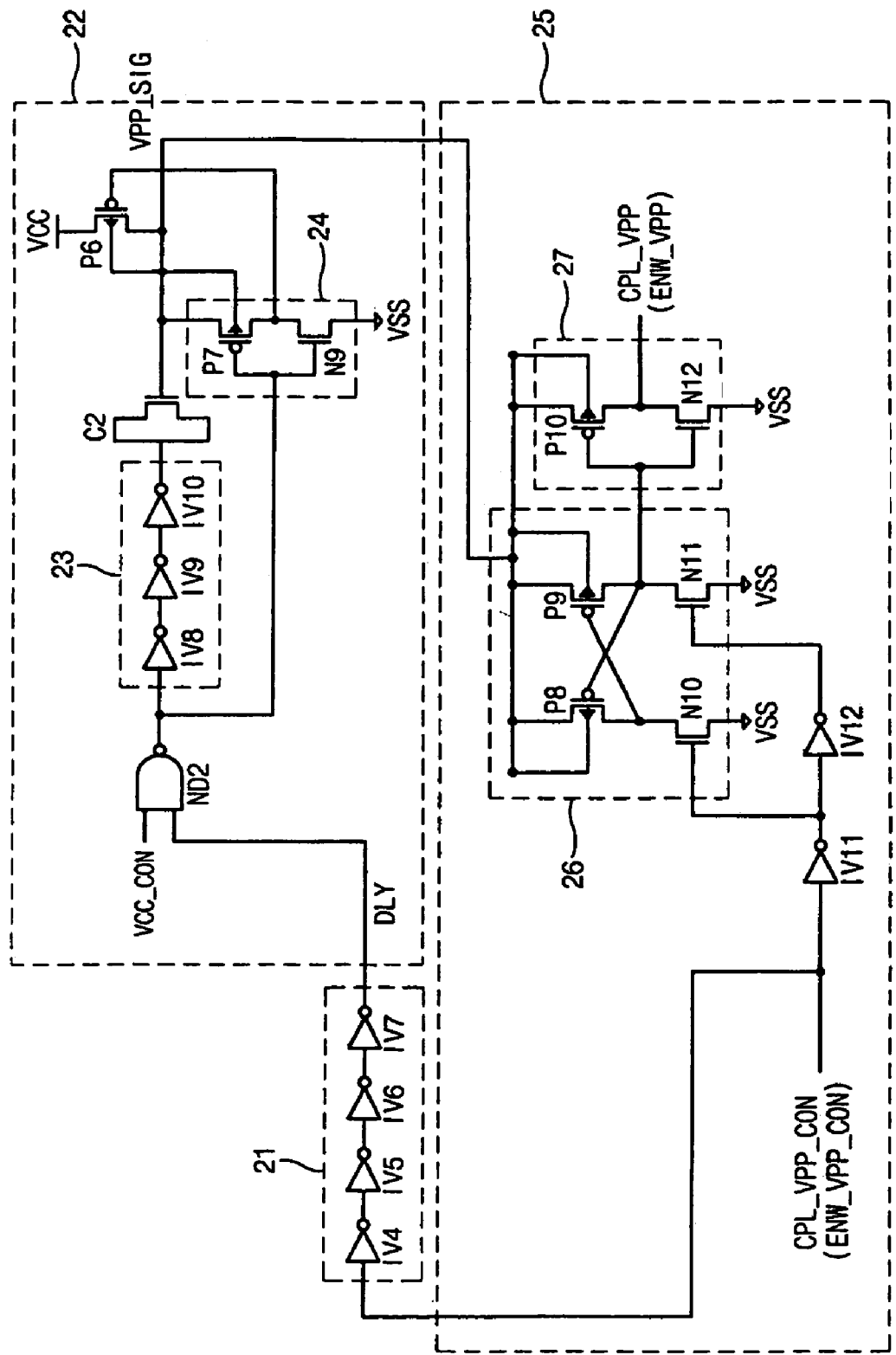
FIG. 12 is a detailed circuit diagram showing a cell plate voltage controller and a write enable voltage controller of FIG. 4.

FIG. 12 is a detailed circuit diagram showing the cell plate voltage controller 20 FIG. 4.

The delay unit 21 comprises inverter chains IV4~IV7 for outputting the delay signal DLY by non-inverting and delaying the cell plate control signal CPL_VPP_CON.

The pumping unit 22 comprises a NAND gate ND2, a delay unit 23, a MOS capacitor C2, a driver 24, and a PMOS transistor P6 as a pull-up driving device. The NAND gate ND2 NANDs the power voltage control signal VCC_CON and the delay signal DLY. The delay unit 23 comprises inverters IV8~IV10 connected with an inverter chain for inverting and delaying an output signal of the NAND gate ND2.

The MOS capacitor C2 pumps a voltage level of the pumping signal VPP_SIG precharged to a power voltage level VCC depending on activation of the PMOS transistor P6. The PMOS transistor P6 connected between a power voltage VCC terminal and an output terminal of the MOS capacitor C1 has a gate to receive an output signal of the driver 24.

The driver 24 comprises a PMOS transistor P7 and a NMOS transistor N9 connected in series between a drain of the PMOS transistor P6 and a ground voltage VSS terminal. The PMOS transistor P7 and the NMOS transistor N9 has a common gate to receive an output signal of the NAND gate ND2.

The level controller 25 comprises inverters IV11 and IV12, a level shifter 26 and a driver 27. The inverter IV11 inverts the cell plate control signal CPL_VPP_CON. The inverter IV12 inverts output signal of the inverter IV11.

The level shifter 26 comprising PMOS transistors P8 and P9; and NMOS transistors N10 and N11 level-shifts the pumping signal VPP_SIG depending on output states of the inverters IV11 and IV12.

The PMOS transistors P8 and P9 has a common source to receive the pumping signal VPP_SIG, and each gate cross-coupled with each drain. The NMOS transistor N10 connected between a drain of the PMOS transistor P8 and the ground voltage VSS terminal has a gate to receive an output signal of the inverter IV11. The NMOS transistor N11 connected between a drain of the PMOS transistor P9 and the ground voltage VSS terminal has a gate to receive an output signal of the inverter IV12.

The driver 27 outputs the cell plate pumping voltage control signal CPL_VPP by driving the pumping signal VPP_SIG in response to an output signal of the level shifter 26. The driver 27 comprises a PMOS transistor P10 and a NMOS transistor N12.

The PMOS transistor P10 and the NMOS transistor N12 connected in series between a pumping signal VPP_SIG applied terminal and the ground voltage VSS terminal has a common gate to receive the output signal of the level shifter 26. The PMOS transistor P10 and the NMOS transistor N12 has a common drain to output the cell plate pumping voltage control signal CPL_VPP.

Figure 13:
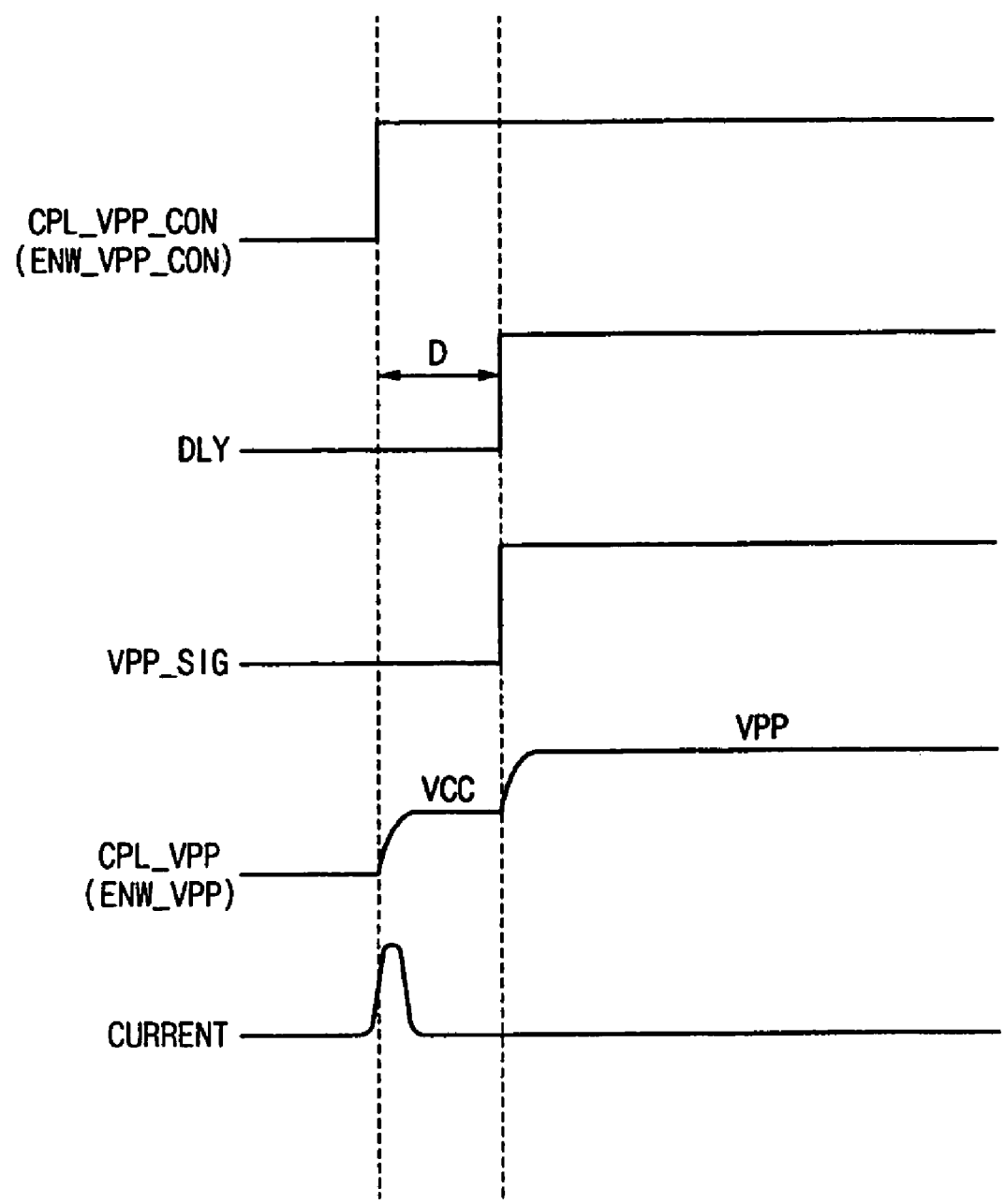
FIG. 13 is a timing diagram showing the operations of the cell plate voltage controller and the write enable voltage controller of FIG. 12.

Referring to FIG. 13, the operation of the cell plate voltage controller 20 (write enable voltage controller 30) is explained.

The power voltage control signal VCC_CON and the cell plate control signal CPL_VPP_CON are inputted at a high level to pump a power voltage VCC in a low voltage region. The delay unit 21 outputs the delay signal DLY by delaying the cell plate control signal CPL_VPP_CON for a delay time D.

As a result, while the power voltage control signal VCC_CON is maintained at a high level, and the delay signal DLY is maintained at a low level for the delay time D, the output signal of the NAND gate ND2 have a high level.

Thereafter, the NMOS transistor N9 of the driver 24 is turned on by the output signal of the NAND gate ND2. As the PMOS transistor P6 is turned on, an output terminal of the MOS capacitor C2 is precharged to a power voltage VCC. As a result, the pumping signal VPP_SIG is maintained at the power voltage level VCC by the output signal of the MOS capacitor C2.

When the cell plate control signal CPL_VPP_CON have a high level, the level shifter 26 outputs a signal having a low level as the NMOS transistor N11 is turned on. As a result, the PMOS transistor P10 of the driver 27 is turned on, and the pumping voltage control signal CPL_VPP is outputted at a power voltage level VCC.

After the delay time D of the delay unit 21, the delay signal DLY of the cell plate control signal CPL_VPP CON is enabled to a high level, and an output signal of the NAND gate ND2 has a low level.

Then, the PMOS transistor P7 of the driver 24 is turned on, and the PMOS transistor P6 is turned off. As a result, the power voltage VCC is pumped by the output signal of the MOS capacitor C2, and the pumping signal VPP_SIG is outputted at the pumping voltage level VPP.

Next, when the output signal of the level shifter 26 is at a low level, the PMOS transistor P10 of the driver 27 is turned on. As a result, the cell plate pumping voltage control signal CPL_VPP is outputted at the pumping voltage level VPP by the pumping signal VPP_SIG having the high level.

On the other hand, when the power voltage control signal VCC_CON as a power voltage limit detection signal, is outputted at a low level in a high voltage region, the NAND gate ND2 outputs an output signal having a high level.

The NMOS transistor N9 of the driver 24 is turned on by the output signal of the NAND gate ND2, and the PMOS transistor P6 is turned on. As a result, the output signal of the MOS capacitor C2 has a low level, and the pumping signal VPP_SIG is outputted at the power voltage level VCC.

Thereafter, the output signal of the level shifter has a low level, and the PMOS transistor P10 of the driver 27 is turned on. Then, the cell plate pumping voltage control signal CPL_VPP is outputted at the power voltage level VCC by the voltage level of the pumping signal VPP_SIG.

As described above, the delay unit 21 activates the pumping unit 22 by delaying the cell plate control signal CPL_VPP_CON for the delay time D, thereby outputting the stable pumping voltage control signal CPL_VPP.

As shown in FIG. 13, when the pumping voltage control signal CPL_VPP is level-shifted from the level of 0V to the power voltage level VCC, a little amount of leakage current is generated in a switching process of the level shifter 26.

The level controller 25 level-shifts the stabilized voltage level of the power voltage VCC after the delay time D of the delay unit 21 to the pumping voltage VPP. As a result, the stable pumping voltage control signal CPL_VPP can be outputted because the loss of current is not generated in a pumping process of the pumping voltage VPP.

Figure 14:
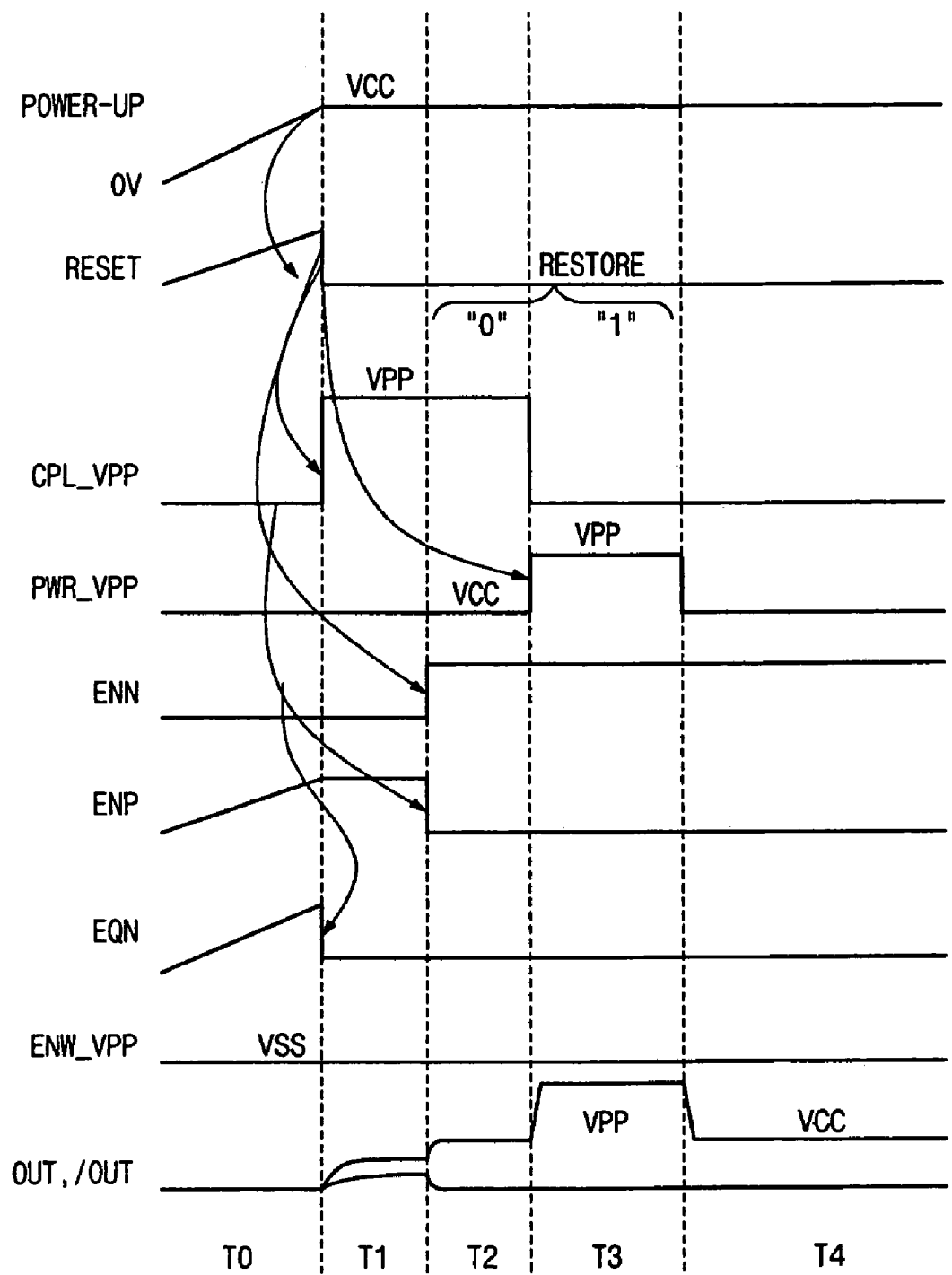
FIGS. 14 and 15 are timing diagrams showing the operations of the nonvolatile FeRAM control device according to the present invention.

FIG. 14 is a timing diagram showing a power-up mode operation of the nonvolatile FeRAM control device according to the present invention.

In a cycle T0, voltage levels of the power voltage VCC and a reset signal slowly rise. In a cycle T1, the power voltage VCC is maintained at the stabilized level.

In the cycle T1, the reset signal RESET and the equalizing signal EQN transit to a low level. The pull-up enable signal ENP for controlling the PMOS transistor P1 which is a pull-up driving device of the unit register UR is enabled to a high level.

The cell plate pumping voltage control signal CPL_VPP is maintained at the pumping voltage level VPP from the cycle T1 to the cycle T2 before the pumping voltage control signal PWR_VPP has the pumping voltage level VPP.

In the cycle T2, the cell plate pumping voltage control signal CPL_VPP is maintained at the pumping voltage level VPP, and the pumping voltage control signal PWR_VPP is maintained at the power voltage level VCC.

Then, if the pull-down enable signal. ENN is enabled to a high level, and the pull-up enable signal ENP is disabled to a low level, the nodes CN1 and CN2 of the unit register UR are amplified to a CMOS level. As a result, the node having data "0" between the output signals OUT and /OUT restores the data "0" at the pumping voltage level VPP. Here, the output signals OUT and /OUT have the power voltage level VCC.

In a cycle T3, the cell plate pumping voltage control signal CPL_VPP transits to the ground voltage level VSS, and the pumping voltage control signal PWR_VPP transits to the pumping voltage level VPP.

As a result, the node having data "1" of the nodes CN1 and CN2 is boosted to the pumping voltage level VPP, and restores the data "1". Here, the output signals OUT and /OUT have the power voltage level VCC.

In a cycle T4, the pumping voltage control signal PWR_VPP transits to the power voltage level VCC, and all operation is maintained at the stable state. As a result, the output signals OUT and /OUT are maintained at the power voltage level VCC. Here, the write enable pumping voltage control signal ENW_VPP is maintained at an inactive state because it does not operate in a power-up mode.

Figure 15:
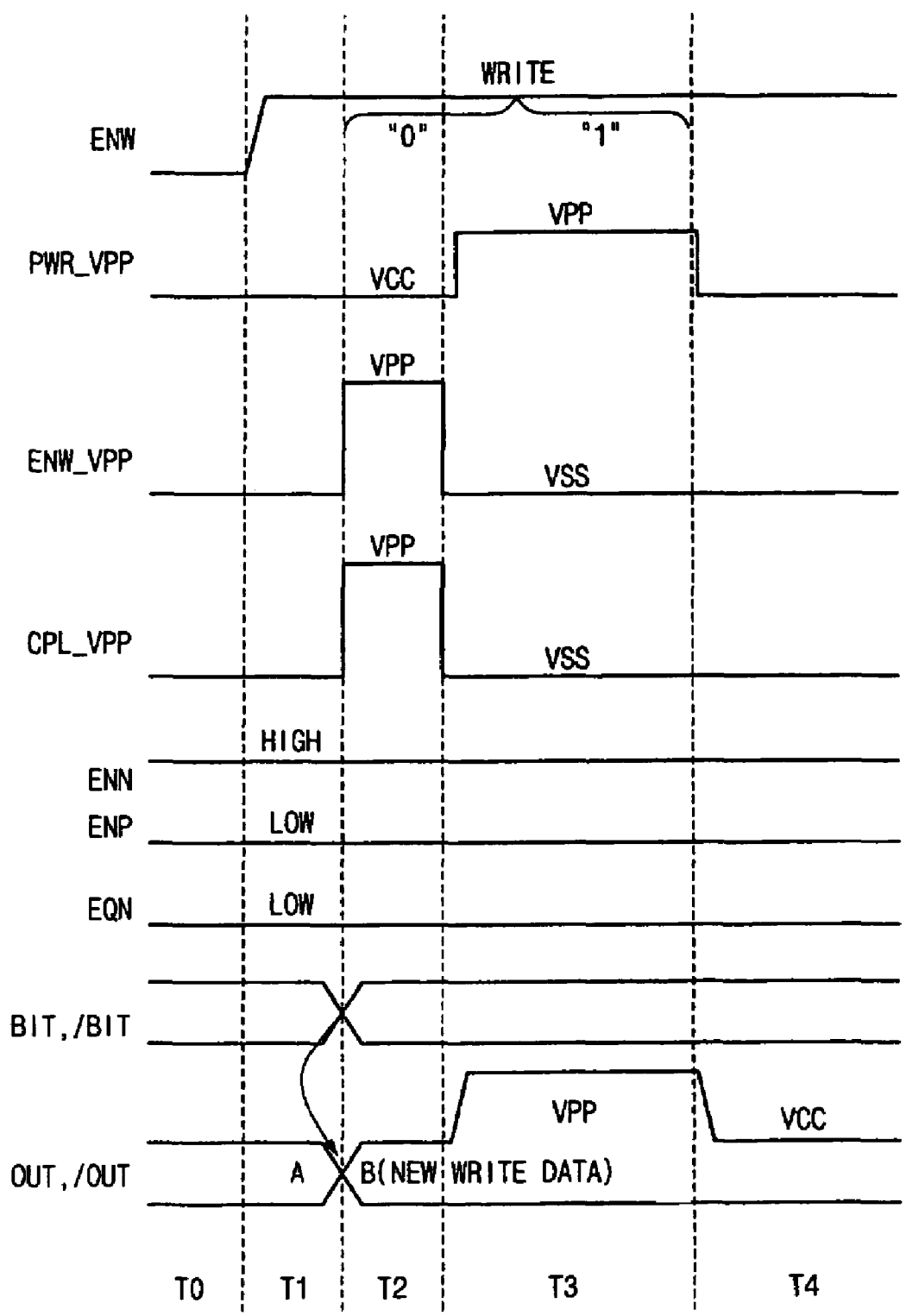

FIG. 15 is a timing diagram showing a write mode operation of the nonvolatile FeRAM control device according to the present invention.

In a cycle T1, the write enable signal ENW is activated to a high level. In a cycle T2, the write enable pumping voltage control signal ENW_VPP and the cell plate pumping voltage control signal CPL_VPP transits from the ground voltage level VSS to the pumping voltage level VPP.

Then, data of the bitlines BIT and /BIT are outputted into the nodes CN1 and CN2 of the unit register UR. As a result, not previous data A but new write data B are outputted as the output signals OUT and /OUT.

Data "0" of the new write data B is written by the cell plate pumping voltage control signal CPL_VPP having the pumping voltage level VPP. Here, the new write data B are maintained at the power voltage level VCC.

In a cycle T3, the pumping voltage control signal PWR_VPP transits from the power voltage level VCC to the pumping voltage level VPP. Then, the write enable pumping voltage control signal ENW_VPP and the cell plate pumping voltage control signal CPL_VPP transit from the pumping voltage level VPP to the ground voltage level VSS.

Data "1" of the output signals OUT and /OUT is boosted to the pumping voltage level VPP, and the data "1" is written in response to the cell plate pumping voltage control signal CPL_VPP.

In a cycle T4, since all operation is maintained at the stable state, the pumping voltage control signal PWR_VPP transits from the pumping voltage level VPP to the power voltage level VCC. As a result, the output signals OUT and /OUT are maintained at the power voltage level VCC.

Figure 16:
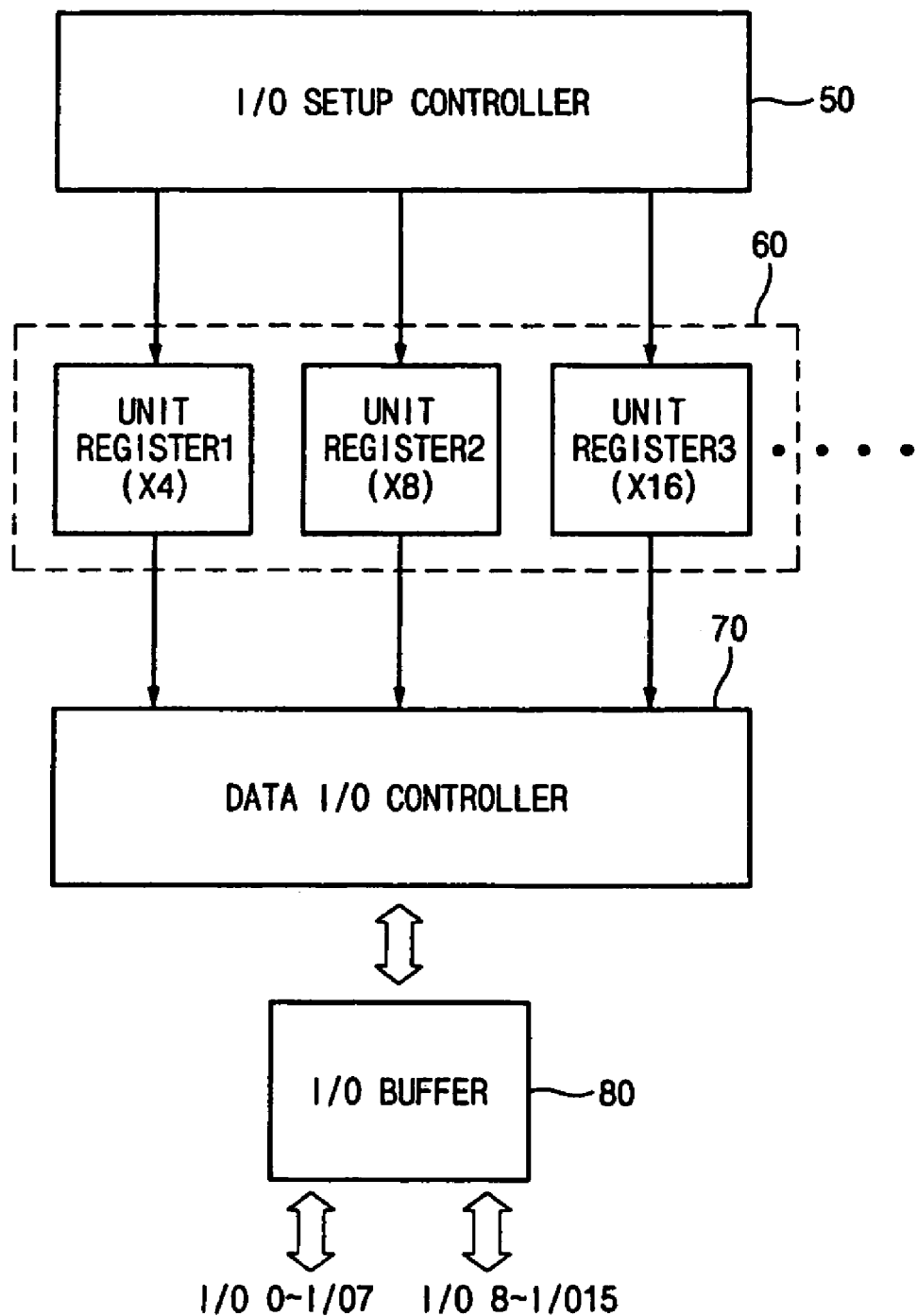
FIGS. 16 and 17 are structural diagrams showing other preferred embodiments of the nonvolatile FeRAM control device according to the present invention.

FIG. 16 shows another preferred embodiment of the nonvolatile FeRAM control device according to the present invention.

The nonvolatile FeRAM control device of FIG. 16 comprises an I/O setup controller 50, a register array 60 including a plurality of unit registers, a data I/O controller 70, and an I/O buffer 80.

The I/O setup controller 50 pre-sets activation of a plurality of data I/O pins including a plurality of sub data I/O pins. Here, the I/O setup controller 50 may process data by a Byte unit of 8 bits or by a Word unit of. 16 bits.

The register array 60 comprises a plurality of unit registers including ferroelectric capacitors shown in FIGS. 4 and 15. The unit register 1 stores data for activating four I/O pins. The unit register 2 stores data for activating eight I/O pins. The unit register 3 stores data for activating 16 I/O pins.

Although the number of unit registers used in the present invention is represented by the registers 1~3, it is not limited in the present invention but it can be differentiated.

The data I/O controller 70 analyzes data applied from the register array 60, and outputs a control signal for activating the corresponding I/O buffer 80 set by encoding.

The I/O buffer 80 finally controls the number of sub I/O pins by selectively using corresponding sub I/O pins I/O0~I/O7 and I/O8~I/O15.

When the unit register 1 is used, data is outputted by using four I/O pins I/O0~I/O3 of the I/O pins I/O0~I/O7. When the unit register 2 is used, data is outputted by using eight I/O0~I/O7. When the unit register 3 is used, data is outputted by using 16 I/O pins I/O0~I/O15.

Figure 17:
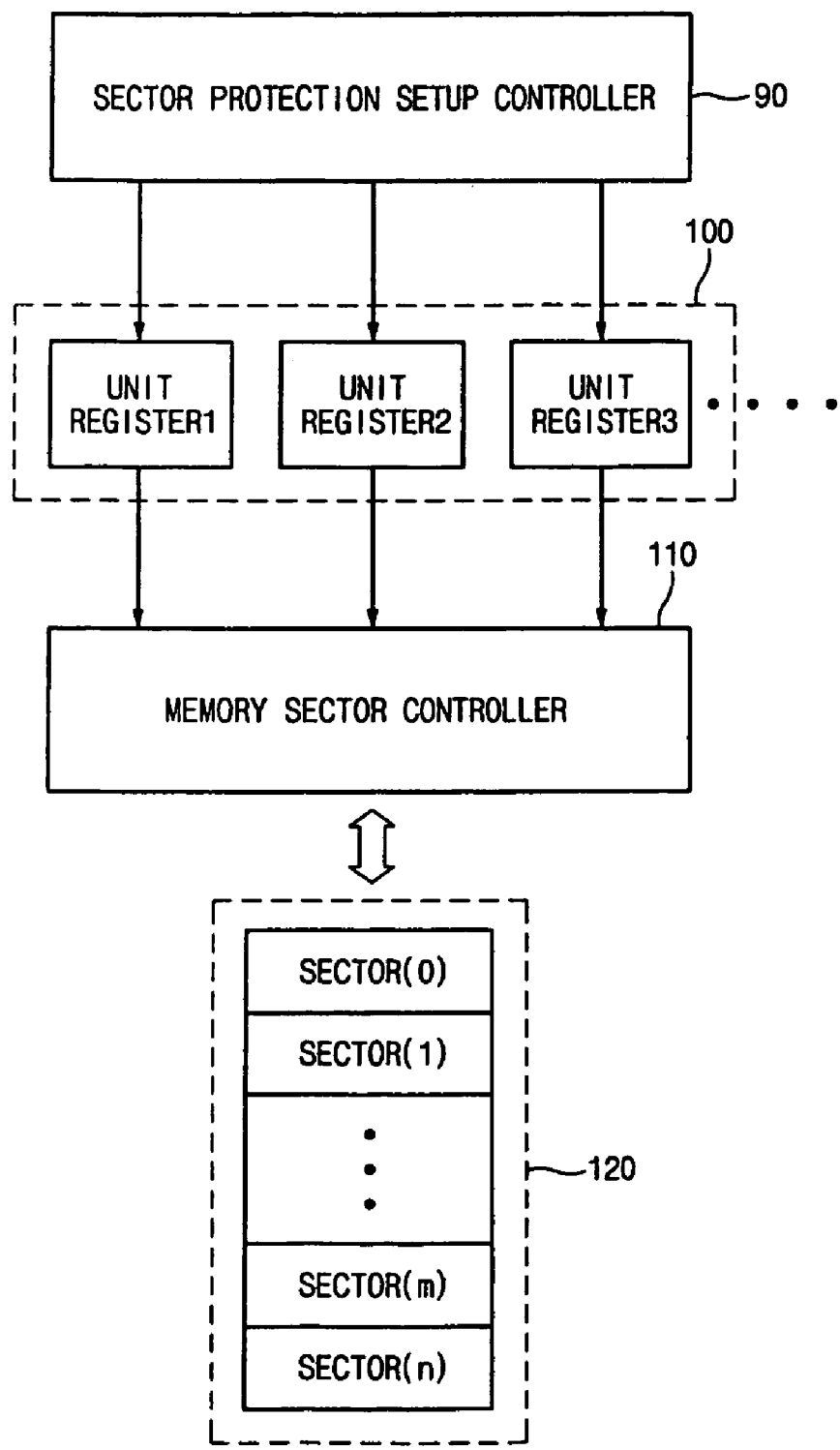

FIG. 17 is still another preferred embodiment of the nonvolatile FeRAM memory device according to the present invention.

The nonvolatile FeRAM memory device of FIG. 17 comprises a sector protection setup controller 90, a register array 100 including a plurality of unit registers and a memory sector controller 110.

The sector protection setup controller 90 sets up a sector protection region in a memory array region 120 including a plurality of sector regions. As a result, data written by unintentional condition are not allowed to be changed in the memory array region 120.

The register array 100 comprises a plurality of unit registers including ferroelectric capacitors shown in FIGS. 4 and 15. The register array 100 comprises unit registers corresponding to each sector array in the memory array region 120.

When the memory sector controller 110 receives corresponding sector information to be protected from the register array 100. The memory sector controller 110 controls data not to be written in a corresponding sector of the memory array region 120 by analyzing the applied sector information.

As discussed earlier, a nonvolatile FeRAM control device of the present invention performs a pumping operation with minimum power consumption in a low voltage region, and provides a stable redundancy and a reference voltage level, thereby improving reliability of a chip.

What is claimed is:

1. A nonvolatile FeRAM control device, comprising:
   an I/O setup controller configured to set up activation or inactivation of a plurality of sub data I/O pins included in a plurality of data I/O pins;
   a register array configured to comprise a plurality of unit registers including a nonvolatile ferroelectric capacitor, and to be selectively activated depending on the control of the I/O setup controller;
   a data I/O controller configured to output a control signal for setting up an I/O pin by analyzing data applied from the register array; and
   an I/O buffer configured to selectively activate the plurality of sub data I/O pins in response to a control signal applied from the data I/O controller.

2. The nonvolatile FeRAM control device of claim 1, wherein the register array further comprises:
   a pumping voltage controller configured to output a pumping voltage control signal by receiving a power voltage control signal having a different output level according to a power voltage region where a power voltage belongs when a power control signal is applied;
   a cell plate voltage controller configured to output a cell plate pumping voltage control signal depending on states of the power voltage control signal when a cell plate control signal is applied; and
   a write enable voltage controller configured to output a write enable pumping voltage control signal depending on states of the power voltage control signal when a write enable control signal is applied,
   wherein voltages of data stored in the nonvolatile ferroelectric capacitor are boosted and outputted depending on voltage levels of the pumping voltage control signal, the cell plate pumping voltage control signal and the write enable pumping voltage control signal.

3. A nonvolatile FeRAM control device, comprising:
   a sector protection setup controller configured to set up a sector protection region for protecting data written in a memory array region including a plurality of sector regions;
   a register array configured to comprise a plurality of unit registers including a nonvolatile ferroelectric capacitor, and to be selectively activated depending on the control of the sector protection setup controller; and
   a memory sector controller configured to control a corresponding sector of the memory array region by analyzing sector protection information applied from the register array.

4. The nonvolatile FeRAM control device of claim 3, wherein the register array comprises:
   a pumping voltage controller configured to output a pumping voltage control signal by receiving a power voltage control signal having a different output level according to a power voltage region where a power voltage belongs when a power control signal is applied;
   a cell plate voltage controller configured to output a cell plate pumping voltage control signal depending on states of the power voltage control signal when a cell plate control signal is applied; and
   a write enable voltage controller configured to output a write enable pumping voltage control signal depending on states of the power voltage control signal when a write enable control signal is applied,
   wherein voltages of data stored in the nonvolatile ferroelectric capacitor are boosted and outputted depending on voltage levels of the pumping voltage control signal, the cell plate pumping voltage control signal and the write enable pumping voltage control signal.

* * * * *